(12) United States Patent
Li (10) Patent No.: US 12,224,153 B2
(45) Date of Patent: *Feb. 11, 2025

(54) ELECTRON MICROSCOPE

(71) Applicant: FOCUS-EBEAM TECHNOLOGY (BEIJING) CO., LTD., Beijing (CN)

(72) Inventor: Shuai Li, Beijing (CN)

(73) Assignee: FOCUS-EBEAM TECHNOLOGY (BEIJING) CO., LTD., Beijing (CN)

( * ) Notice: Subject to any disclaimer, the term of this patent is extended or adjusted under 35 U.S.C. 154(b) by 358 days.

This patent is subject to a terminal disclaimer.

(21) Appl. No.: 17/758,363

(22) PCT Filed: Dec. 3, 2021

(86) PCT No.: PCT/CN2021/135541
§ 371 (c)(1),
(2) Date: Jul. 5, 2022

(87) PCT Pub. No.: WO2022/083789
PCT Pub. Date: Apr. 28, 2022

(65) Prior Publication Data
US 2023/0028903 A1 Jan. 26, 2023

(30) Foreign Application Priority Data
Dec. 2, 2020 (CN) .......................... 202011393110.0

(51) Int. Cl.
*H01J 37/24* (2006.01)
*H01J 37/14* (2006.01)
(Continued)

(52) U.S. Cl.
CPC .......... *H01J 37/244* (2013.01); *H01J 37/147* (2013.01); *H01J 37/261* (2013.01); *H01J 37/28* (2013.01)

(58) Field of Classification Search
CPC ...... H01J 37/244; H01J 37/147; H01J 37/261; H01J 37/28
See application file for complete search history.

(56) References Cited

U.S. PATENT DOCUMENTS 4,675,524 A   6/1987 Frosien
4,785,176 A   11/1988 Frosien
(Continued)

FOREIGN PATENT DOCUMENTS

CN   1042029 A   5/1990
CN   1630926 A   6/2005
(Continued)

OTHER PUBLICATIONS

International Search Report in the international application No. PCT/CN2021/135541, mailed on Jan. 30, 2022.
(Continued)

*Primary Examiner* — Nicole M Ippolito
(74) *Attorney, Agent, or Firm* — Syncoda LLC; Feng Ma (57) ABSTRACT

An electron microscope includes: an electron source, which is configured to generate an electron beam; a first beam conduit, which is configured to accelerate the electron beam; a second beam conduit, which is configured to accelerate the electron beam; a first detector, which is disposed between the first beam conduit and the second beam conduit and configured to receive secondary electrons generated by the electron beam acting on a sample to be tested; and a control electrode, which is disposed between the first detector and an optical axis of the electron beam and configured to change the direction of movement of backscattered electrons and the secondary electrons generated by the electron beam acting on said sample.

10 Claims, 4 Drawing Sheets

(51) Int. Cl.
  *H01J 37/147* (2006.01)
  *H01J 37/244* (2006.01)
  *H01J 37/26* (2006.01)
  *H01J 37/28* (2006.01)

(56) References Cited

U.S. PATENT DOCUMENTS

| | | | |
|---|---|---|---|
| 4,831,266 A | 5/1989 | Frosien | |
| 4,926,054 A | 5/1990 | Frosien | |
| 4,963,823 A | 10/1990 | Otto | |
| 5,146,090 A | 9/1992 | Plies | |
| 5,608,218 A | 3/1997 | Sato | |
| 5,780,859 A | 7/1998 | Feuerbaum | |
| 5,872,358 A | 2/1999 | Todokoro | |
| 5,939,720 A | 8/1999 | Todokoro | |
| 6,107,633 A | 8/2000 | Frosien | |
| 6,194,729 B1 | 2/2001 | Weimer | |
| 6,392,231 B1 | 5/2002 | Chen | |
| 6,407,387 B1 | 6/2002 | Frosien | |
| 6,444,981 B1 | 9/2002 | Todokoro | |
| 6,498,345 B1 | 12/2002 | Weimer | |
| 6,512,228 B2 | 1/2003 | Todokoro | |
| 6,617,579 B2 | 9/2003 | Yonezawa | |
| 6,642,520 B2 | 11/2003 | Kimura | |
| 6,667,476 B2 | 12/2003 | Todokoro | |
| 6,855,938 B2 | 2/2005 | Preikszas | |
| 6,872,944 B2 | 3/2005 | Todokoro | |
| 7,233,008 B1 | 6/2007 | Petrov | |
| 7,425,701 B2 | 9/2008 | Steigerwald | |
| 7,544,937 B2 | 6/2009 | Frosien | |
| 7,705,302 B2 | 4/2010 | Aoki | |
| 7,759,653 B2 | 7/2010 | Chen | |
| 7,928,405 B2 | 4/2011 | Adamec | |
| 7,960,697 B2 | 6/2011 | Chen | |
| 8,319,192 B2 | 11/2012 | Ren | |
| 8,742,342 B2 | 6/2014 | Okai | |
| 8,785,879 B1 | 7/2014 | Frosien | |
| 9,000,370 B2 | 4/2015 | Ren et al. | |
| 9,029,766 B2 | 5/2015 | Morishita | |
| 9,354,188 B2 | 5/2016 | Albiez | |
| 9,362,086 B2 | 6/2016 | Lubomír | |
| 9,490,100 B2 | 11/2016 | Sytar et al. | |
| 9,583,306 B2 | 2/2017 | Li | |
| 9,601,303 B2 | 3/2017 | Frosien | |
| 9,620,331 B1 | 4/2017 | Bhattiprolu | |
| 9,767,986 B2 | 9/2017 | Brown | |
| 9,934,939 B2 | 4/2018 | Kim | |
| 10,008,360 B2 | 6/2018 | Li | |
| 10,103,002 B1 | 10/2018 | Gamm | |
| 10,658,152 B1 | 5/2020 | Hendrich | |
| 10,777,382 B2 * | 9/2020 | Li | H01J 37/28 |
| 2002/0104969 A1 | 8/2002 | Chen | |
| 2002/0148960 A1 | 10/2002 | Todokoro | |
| 2003/0127604 A1 | 7/2003 | Todokoro | |
| 2003/0209667 A1 | 11/2003 | Petrov et al. | |
| 2004/0046125 A1 | 3/2004 | Chen | |
| 2004/0056207 A1 | 3/2004 | Petrov et al. | |
| 2004/0089805 A1 | 5/2004 | Todokoro | |
| 2004/0245465 A1 | 12/2004 | Steigerwald | |
| 2006/0049348 A1 | 3/2006 | Petrov et al. | |
| 2006/0060780 A1 | 3/2006 | Masnaghetti et al. | |
| 2006/0163478 A1 | 7/2006 | Jaksch et al. | |
| 2006/0186351 A1 | 8/2006 | Nishiyama | |
| 2006/0226360 A1 | 10/2006 | Frosien | |
| 2008/0099674 A1 | 5/2008 | Bihr et al. | |
| 2008/0121810 A1 | 5/2008 | Liu et al. | |
| 2008/0191135 A1 | 8/2008 | Aoki et al. | |
| 2008/0230694 A1 | 9/2008 | Frosien | |
| 2010/0038538 A1 | 2/2010 | Drexel | |
| 2010/0297362 A1 | 11/2010 | Budach et al. | |
| 2012/0025074 A1 | 2/2012 | Barbi | |
| 2012/0049064 A1 | 3/2012 | Ren | |
| 2013/0214155 A1 | 8/2013 | Winkler | |
| 2014/0077079 A1 | 3/2014 | Hoque et al. | |
| 2014/0175279 A1 | 6/2014 | Agemura | |
| 2014/0361167 A1 | 12/2014 | Morishita | |
| 2016/0064184 A1 | 3/2016 | Brown et al. | |
| 2016/0172150 A1 | 6/2016 | Li | |
| 2016/0217968 A1 | 7/2016 | Li et al. | |
| 2016/0225582 A1 | 8/2016 | Schultz et al. | |
| 2016/0365221 A1 | 12/2016 | Preikszas | |
| 2017/0018394 A1 | 1/2017 | Sohda et al. | |
| 2017/0047192 A1 | 2/2017 | Frosien | |
| 2017/0236683 A1 | 8/2017 | Hegele et al. | |
| 2017/0271124 A1 | 9/2017 | Sasaki et al. | |
| 2017/0309443 A1 | 10/2017 | Han | |
| 2017/0329025 A1 | 11/2017 | Brown et al. | |
| 2018/0286632 A1 | 10/2018 | Biberger | |
| 2018/0364563 A1 | 12/2018 | Virdi et al. | |
| 2019/0385810 A1 | 12/2019 | Sato et al. | |
| 2020/0075287 A1 | 3/2020 | Jen et al. | |
| 2020/0234914 A1 | 7/2020 | Li | |
| 2020/0273665 A1 | 8/2020 | Morishita | |
| 2020/0333271 A1 | 10/2020 | Hendrich et al. | |
| 2021/0110994 A1 | 4/2021 | Li et al. | |
| 2023/0317404 A1* | 10/2023 | Li | H01J 37/1474 |

FOREIGN PATENT DOCUMENTS

| | | |
|---|---|---|
| CN | 1820194 A | 8/2006 |
| CN | 101388317 A | 3/2009 |
| CN | 101390186 A | 3/2009 |
| CN | 101996839 A | 3/2011 |
| CN | 103733299 A | 4/2014 |
| CN | 103839743 A | 6/2014 |
| CN | 103890895 A | 6/2014 |
| CN | 104897700 A | 9/2015 |
| CN | 106575594 A | 4/2017 |
| CN | 106920723 A | 7/2017 |
| CN | 207425790 U | 5/2018 |
| CN | 108231511 A | 6/2018 |
| CN | 108807118 A | 11/2018 |
| CN | 208256614 U | 12/2018 |
| CN | 109300759 A | 2/2019 |
| CN | 110376229 A | 10/2019 |
| CN | 110383414 A | 10/2019 |
| CN | 110869752 A | 3/2020 |
| EP | 1435640 A2 | 7/2004 |
| JP | 2000164167 A | 6/2000 |
| JP | 2000188310 A | 7/2000 |
| JP | 2005521215 A | 7/2005 |
| JP | 2008004329 A | 1/2008 |
| JP | 2009037939 A | 2/2009 |
| JP | 5004318 B2 | 8/2012 |
| JP | 2013058314 A | 3/2013 |
| JP | 2015170518 A | 9/2015 |
| JP | 2017199606 A | 11/2017 |
| WO | 2013035389 A1 | 3/2013 |
| WO | 2019100600 A1 | 5/2019 |

OTHER PUBLICATIONS

English translation of the Written Opinion of the International Search Authority in the international application No. PCT/CN2021/135541, mailed on Jan. 30, 2022, 4 pages.
International Search Report in the international application No. PCT/CN2022/074101, mailed on Apr. 12, 2022. 6 pages with English translation.
Written Opinion of the International Search Authority in the international application No. PCT/CN2022/074101, mailed on Apr. 12, 2022. 6 pages with English translation.
International Search Report in the international application No. PCT/CN2018/075564, mailed on Aug. 23, 2018. 5 pages.
Written Opinion of the International Search Authority in the international application No. PCT/CN2018/075564, mailed on Aug. 23, 2018. 5 pages.
International Search Report in the international application No. PCT/CN2018/085300, mailed on Aug. 21, 2018. 4 pages.
Written Opinion of the International Search Authority in the international application No. PCT/CN2018/085300, mailed on Aug. 21, 2018. 4 pages.

(56) References Cited

OTHER PUBLICATIONS

International Search Report in the international application No. PCT/CN2019/100871, mailed on Oct. 30, 2019. 3 pages.
Written Opinion of the International Search Authority in the international application No. PCT/CN2019/100871, mailed on Oct. 30, 2019. 5 pages.
Supplementary European Search Report in the European application No. 19876263.5, mailed on May 7, 2021. 10 pages.

* cited by examiner

ELECTRON MICROSCOPE

CROSS-REFERENCE TO RELATED APPLICATIONS

This application is a National Stage of International Application No. PCT/CN2021/135541 filed on Dec. 3, 2021, which claims priority to Chinese Patent Application No. 202011393110.0 filed on Dec. 2, 2020. The disclosures of these applications are hereby incorporated by reference in their entirety.

TECHNICAL FIELD

The present disclosure relates to the technical field of microscope equipment, in particular to an electron microscope.

BACKGROUND

In the related art, a scanning electron microscope is a commonly used microscopic analysis instrument, in which an electron beam is converged on a specimen to be tested through an objective lens of the scanning electron microscope to generate a micro beam spot, in an area of which the electron beam acts on the specimen to be tested to generate secondary electrons (SEs), backscattered electrons (BSEs) and other signal electrons, and morphology of the surface of the specimen to be tested can be observed by a detector and the material composition of the specimen to be tested can be analyzed.

The secondary electrons can denote the morphological features of the specimen to be tested, the backscattered electrons are related to the atomic number of the specimen to be tested, and more to denote material information of the specimen to be tested. The backscattered electrons emitted at a small angle relative to the surface of the specimen to be tested are affected by the surface fluctuation of the specimen to be tested, and thus can also reflect morphology of the surface of the specimen to be tested. Thus, different types of signal electrons, signal electrons emitted at different angles reflect different information of the specimen to be tested. Therefore, by detecting pure secondary electrons and backscattered electrons, respectively, it is possible to form a picture with a better contrast to reflect information of surface morphology or material, thereby facilitating more accurate analysis of the specimen to be tested.

The present disclosure is hereby proposed.

SUMMARY

The technical problem to be solved by the embodiments of the present disclosure is to overcome the deficiencies of the related art, and provide an electron microscope capable of detecting pure secondary electrons generated by a electron beam acting on a specimen to be tested.

In order to solve the above technical problem, the basic idea of the technical solution adopted in the embodiments of the present disclosure is as follows.

An electron microscope includes an electron source, a first beam guide, a second beam guide, a first detector and a control electrode.

The electron source is configured to generate an electron beam.

The first beam guide is configured to accelerate the electron beam.

The second beam guide is configured to accelerate the electron beam.

The first detector is arranged between the first beam guide and the second beam guide, and is configured to receive secondary electrons generated by the electron beam acting on a specimen to be tested.

The control electrode is arranged between the first detector and an optical axis of the electron beam, and is configured to change movement directions of backscattered electrons and the secondary electrons generated by the electron beam acting on the specimen to be tested.

In the above solution, the control electrode has a porous structure.

In the above solution, the control electrode is of an annular shape, a groove is provided on an outer side wall of the annular shape, and the first detector is arranged in the groove.

In the above solution, the groove is an annular groove.

In the above solution, the first detector includes a plurality of first detectors circumferentially spaced in the annular groove.

In some alternative embodiments, a radial cross-section of the groove includes a first section, a second section, and a third section connected in sequence in a top-to-bottom direction, and the third section is inclined downwardly at a first angle to a horizontal plane.

In the above solution, the first angle is in an angle range of fifteen degrees to seventy-five degrees.

In some alternative embodiments, the third section is a curve.

In some alternative embodiments, the first section is inclined upwardly at a second angle to the horizontal plane, the second angle in an angle range of zero degrees to ninety degrees, and the second section is arranged perpendicular to the horizontal plane.

In some alternative embodiments, the electron microscope further includes a second detector.

The second detector arranged between the first beam guide and the control electrode, configured to receive backscattered electrons generated by the electron beam acting on the specimen to be tested.

With the above technical solution, the embodiments of the present disclosure have the following advantages as compared with the related art.

According to an embodiment of the present disclosure, an electron microscope is provided, in which a first detector is arranged between a first beam guide and a second beam guide, and a control electrode is arranged between the first detector and an optical axis of the electron beam. The control electrode changes movement directions of backscattered electrons and the secondary electrons generated by the electron beam generated by an electron source acting on the specimen to be tested, so that the first detector can receive pure secondary electrons generated by the electron beam acting on the specimen to be tested.

The specific implementations of the present disclosure will be described in further detail in conjunction with the drawings.

BRIEF DESCRIPTION OF THE DRAWINGS

The drawings, as a part of the present disclosure, are used to provide a further understanding of the present disclosure. The schematic embodiments of the present disclosure and its description serve to explain the present disclosure, but do not constitute inappropriate limitations for the present disclosure. It will be apparent that the drawings in the following description are merely embodiments, and that other drawings may be drawn from these drawings without creative efforts for those skilled in the art. In the drawings.

In the drawings: 1. Electron source; 2. Electron acceleration structure; 3. First beam guide; 4. First lens device; 5 Second detector; 6. Control electrode; 7. First detector; 8. Second beam guide; 9. First deflector; 10. Second deflector; 11. Second lens device; 12. Specimen to be tested; 13. Specimen stage; 14. First section; 15, Second section; 16, Third section; 17. Optical axis.

It should be noted that these drawings and text descriptions are not intended to limit the scope of the present disclosure in any way, but rather to illustrate the concept of the present disclosure to those skilled in the art by referring to specific embodiments.

DETAILED DESCRIPTION

In order to make the objects, technical solutions and advantages of the embodiments of the present disclosure clearer, the technical solutions in the embodiments will be clearly and completely described below in conjunction with the drawings in the embodiments of the present disclosure. The following embodiments are intended to illustrate the present disclosure, but are not intended to limit the scope of the present disclosure.

In the description of the present disclosure, it should be noted that the orientation or positional relationship indicated by the terms "upper", "lower", "front", "back", "left", "right", "vertical", "inside", "outside" and the like is based on the orientation or positional relationship shown in the drawings, and is only for convenience of description and simplification of description of the present disclosure, rather than indicating or implying that the device or element must have a specific orientation, be constructed and operated in the specific orientation, and therefore should be construed as limitations the present disclosure.

In the description of the present disclosure, it should be noted that, unless otherwise clearly defined and limited, the terms "install", "linked" and "connected" should be understood in a broad sense. For example, it may be a fixed connection, a detachable connection, or an integral connection; it may be a mechanical connection or an electrical connection; it may be directly connected or indirectly connected through an intermediate medium. For those skilled in the art, the specific meanings of the above terms in the present disclosure may be understood in specific situations.

As shown in FIGS. 1 to 4, an electron microscope according to an embodiment of the present disclosure includes an electron source 1, a first beam guide 3, a second beam guide 8, a first detector 7, and a control electrode 6.

The electron source 1 is configured to generate an electron beam. The first beam guide 3 is configured to accelerate the electron beam. The second beam guide 8 is configured to accelerate the electron beam. The first detector 7 is arranged between the first beam guide 3 and the second beam guide 8, and is configured to receive secondary electrons generated by the electron beam acting on a specimen to be tested 12. The control electrode 6 is arranged between the first detector 7 and an optical axis 17 of the electron beam, and is configured to change movement directions of the backscattered electrons and secondary electrons generated by the electron beam acting on the specimen to be tested 12.

According to an embodiment of the present disclosure, an electron microscope is provided with an electron source 1, a first beam guide 3, a first detector 7, a control electrode 6, a second beam guide 8, and a specimen stage 13 in sequence along the direction from the electron source 1 to a specimen to be tested 12. The control electrode 6 is arranged between the first detector 7 and an optical axis 17 of the electron beam.

The electron beam generated by the electron source 1 passes through the first beam guide 3, the control electrode 6, and the second beam guide 8 in sequence and acts on the specimen to be tested 12 placed on the specimen stage 13. The electron beam acts on the specimen to be tested 12 to generate backscattered electrons and secondary electrons. The control electrode 6 changes movement directions of the backscattered electrons and secondary electrons generated by the electron beam acting on the specimen to be tested 12. The first detector 7 receives secondary electrons generated by the electron beam acting on the specimen to be tested 12.

Since the energy difference between the backscattered electrons and the secondary electrons is large, the control electrode 6 has different influences on the backscattered electrons and the secondary electrons, so that the movement directions of the backscattered electrons and the secondary electrons are changed differently. By controlling the voltage value of the control electrode 6, the movement directions of the backscattered electrons and the secondary electrons can be changed, thereby separating the backscattered electrons and the secondary electrons. The secondary electrons of which the movement direction is changed are received by the first detector 7, which is capable of receiving pure secondary electrons.

According to an embodiment of the present disclosure, an electron microscope is provided, in which a first detector 7 is arranged between a first beam guide 3 and a second beam guide 8, and a control electrode 6 is arranged between the first detector 7 and an optical axis 17 of an electron beam. The control electrode 6 changes the movement directions of backscattered electrons and secondary electrons generated by an electron beam generated by an electron source 1 acting on a specimen to be tested 12, so that the first detector 7 can receive pure secondary electrons generated by the electron beam acting on the specimen to be tested 12.

Figure 1:
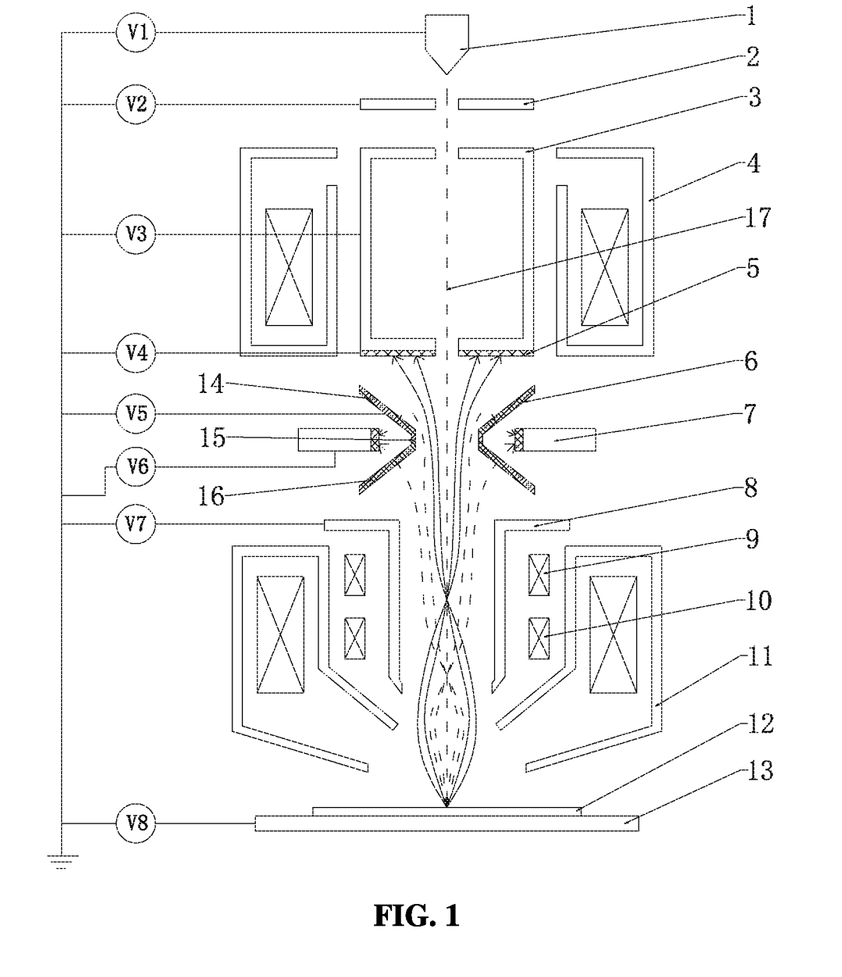
FIG. 1 is an overall schematic structural diagram of an implementation of an electron microscope according to an embodiment of the present disclosure.
Figure 3:
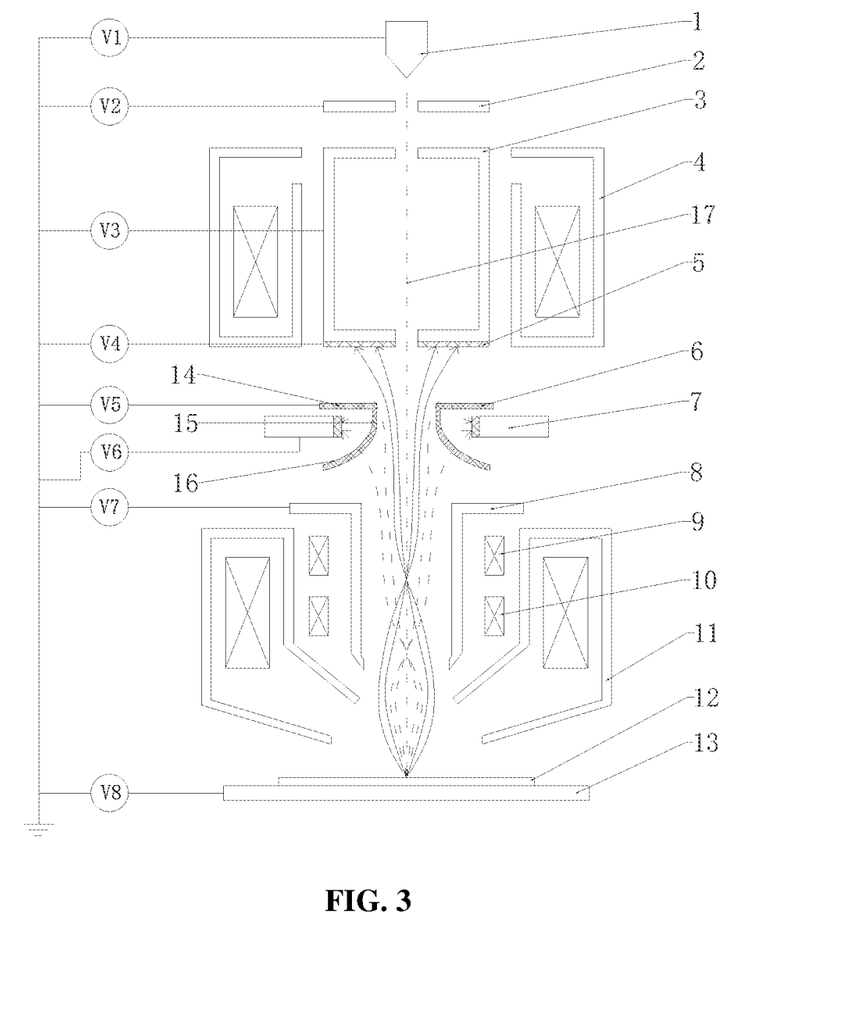
FIG. 3 is an overall schematic structural diagram of another embodiment of an electron microscope according to an embodiment of the present disclosure.

In the above solution, as shown in FIGS. 1 and 3, in an electron microscope according to an embodiment of the present disclosure, the control electrode 6 has a porous structure.

The control electrode 6 is arranged between the first detector 7 and the optical axis 17 of the electron beam. The electron beam acts on the specimen to be tested 12 to generate the backscattered electrons and secondary electrons. Due to the low energy of the secondary electrons, the secondary electrons are greatly influenced by the electric field among the control electrode 6, the second beam guide 8 and the first beam guide 3 when the backscattered electrons and secondary electrons pass through the second beam guide 8 and the control electrode 6. The movement direction of the secondary electrons is changed. Since the control electrode 6 has a porous structure, the secondary electrons would pass through holes in the control electrode 6 and be received by the first detector 7.

In the above solution, as shown in FIGS. 1 to 4, in an electron microscope according to an embodiment of the present disclosure, the control electrode 6 is of an annular shape, a groove is provided on an outer side wall of the annular shape, and the first detector 7 is arranged in the groove.

The control electrode 6 is of an annular shape, and a central hole of the annular shape is configured to pass the electron beam, the backscattered electrons, and the secondary electrons. A groove is provided on the outer side wall of the annular shape in the direction of the center hole along the outer circumference of the annular shape, and the first detector 7 is arranged in the groove. Since the control electrode 6 has a porous structure, the first detector 7 arranged in the groove is closer to the optical axis 17 and receives secondary electrons more efficiently.

In the above solution, as shown in FIGS. 1 to 4, in an electron microscope according to an embodiment of the present disclosure, the groove is an annular groove.

The control electrode 6 is of an annular shape, and a central hole of the annular shape is configured to allow the electron beam, the backscattered electrons, and the secondary electrons to pass through. A groove is provided on the outer side wall of the annular shape in the direction of the center hole along the outer circumference of the annular shape, and the groove is annular in shape. An annular groove is provided on the outer side wall of the control electrode 6, so that the first detector 7 can be installed in a groove in any direction.

In the above solution, as shown in FIGS. 1 and 3, in an electron microscope according to an embodiment of the present disclosure, the first detector 7 includes a plurality of first detectors 7 circumferentially spaced in the annular groove.

A plurality of first detectors 7 may be provided, and the plurality of first detectors 7 may be spaced apart in the circumferential direction of the annular groove. Those skilled in the art may set specific positions of the first detectors 7 according to actual conditions, such as space, etc.

Due to the shielding effect of the control electrode 6 on the first detector 7, the first detector 7 would not interfere with the trajectory of the electron beam, and therefore the first detector 7 may be arranged at any position in the annular groove.

In one embodiment, the plurality of first detectors 7 are circumferentially spaced in the annular groove evenly.

In another embodiment, the first detector 7 may also be an annular detector with a higher detection efficiency.

Figure 2:
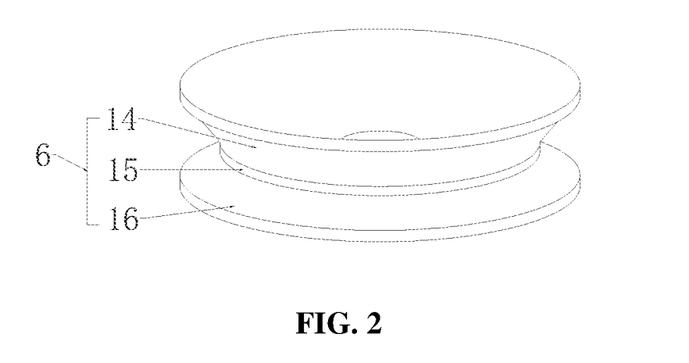
FIG. 2 is a schematic structural diagram of the control electrode in FIG. 1 according to an embodiment of the present disclosure.

In some alternative embodiments, as shown in FIGS. 1 to 2, in an electron microscope according to an embodiment of the present disclosure, a radial cross-section of the groove includes a first section 14, a second section 15, and a third section 16 connected in sequence in a top-to-bottom direction, and the third section 16 is inclined downwardly at a first angle to a horizontal plane.

Specifically, in a top-to-bottom direction, that is, along the movement direction of electron beam, the radial cross-section of the groove includes the first section 14, the second section 15, and the third section 16 connected in sequence, and the third section 16 is inclined downwardly at a first angle to a horizontal plane.

The third section 16 is inclined downwardly, and the electric field formed between the end face formed at the third section 16 and the second beam guide 8 changes the trajectories of the backscattered electrons and secondary electrons, so that the secondary electrons would pass through the holes in the control electrode 6, and be received by the first detector 7. The first detector 7 may receive more secondary electrons and has higher receiving efficiency.

In the above solution, the first angle is in a range of fifteen degrees to seventy-five degrees.

The third section 16 is inclined downwardly at a first angle to the horizontal plane. The first angle is in a range of fifteen degrees to seventy-five degrees.

When the value of the first angle that the third section 16 is inclined downwardly with the horizontal plane is in the range of fifteen degrees to seventy-five degrees, the electric field formed between the end face formed at the third section 16 and the second beam guide 8 can better change the trajectories of the backscattered electrons and the secondary electrons, so that the secondary electrons would pass through the holes in the control electrode 6 and be received by the first detector 7. The first detector 7 may receive more secondary electrons and has higher receiving efficiency.

In one embodiment, the third section 16 is inclined downwardly at a first angle to the horizontal plane. The first angle is forty degrees.

Figure 4:
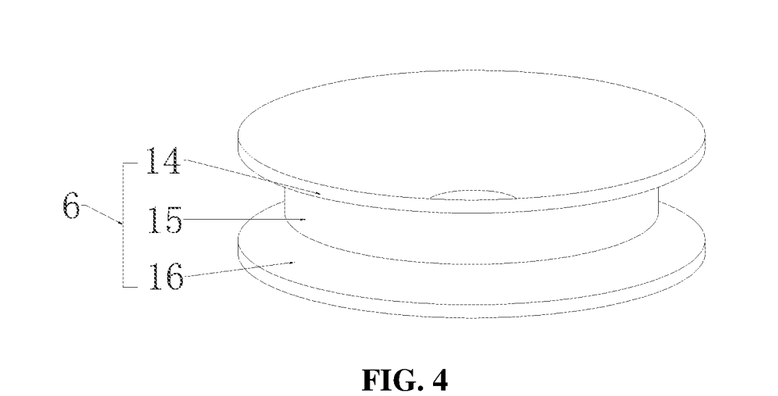
FIG. 4 is a schematic structural diagram of the control electrode in FIG. 2 according to an embodiment of the present disclosure.

In some alternative embodiments, in an electron microscope according to the embodiments of the present disclosure as shown in FIGS. 3 to 4, the third section 16 is a curve.

In order to form the required electric field and better change the trajectories of the backscattered electrons and secondary electrons, the third section 16 may be a curve.

When the third section 16 is a curve, the lower surface of the groove corresponding to the third section 16 is a curved surface, and the bending angle of the curved surface may change the electric field intensity distribution formed between the control electrode 6 and the second beam guide 8. Those skilled in the art may set the required bending angle of the curved surface to form the required electric field intensity distribution according to actual needs, and better change the trajectories of the backscattered electrons and the secondary electrons, so that the secondary electrons would pass through the holes in the control electrode 6 and be received by the first detector 7. The first detector 7 may receive more secondary electrons and has higher receiving efficiency.

In some alternative embodiments, as shown in FIGS. 1 to 4, in an electron microscope according to the embodiments of the present disclosure, the first section 14 is inclined upwardly at a second angle to the horizontal plane, the second angle is in an range of zero degrees to ninety degrees, and the second section 15 is arranged perpendicular to the horizontal plane.

Where the first section 14 is inclined upwardly at a second angle to the horizontal plane, the second angle is in a range of zero degrees to ninety degrees, and in one embodiment, the angle is forty degrees.

The second section 15 is arranged perpendicular to the horizontal plane. The second section 15 is perpendicular to the horizontal plane, and one end of the second section 15 is connected to the first section 14 and the other end is connected to the third section 16. The first section 14 is inclined upwardly and the third section 16 is inclined downwardly. In the groove formed by the first section 14, the second section 15 and the third section 16, the width of the top of the groove is larger than the width of the bottom of the groove, which not only changes the trajectories of the backscattered electrons and the secondary electrons, but also facilitates the installation of the first detector 7. Since the width of the top of the groove is larger than the width of the bottom of the groove, the groove has a larger accommodation space, which facilitates the accommodation of the first detector 7.

In some alternative embodiments, as shown in FIGS. 1 and 3, an electron microscope provided by the embodiments of the present disclosure further includes a second detector 5. The second detector 5 is arranged between the first beam guide 3 and the control electrode 6, and is configured to receive backscattered electrons generated by the electron beam acting on the specimen to be tested 12.

In one embodiment, in some alternative embodiments, the second detector 5 is arranged at the lower end of the first beam guide 3, and the second detector 5 is connected to the lower end of the first beam guide 3. The second detector 5 is at the same voltage value as the first beam guide 3, and is configured to receive the backscattered electrons generated by the electron beam acting on the specimen to be tested 12.

As shown in FIGS. 1 to 4, in some alternative embodiments, among which one embodiment is illustrated below, the electron source 1 is configured to generate an electron beam. Electron sources 1 may be classifed as field emission sources and thermal emission sources. A field emission source includes a thermal field and a cold field. A thermal emission source includes a tungsten wire, lanthanum hexaboride, and the like. In the present disclosure, the electron source 1 may be any electron source 1 configured to generate an electron beam. The voltage value of the electron source 1 provided in the embodiment is −5 kolovolt (kV).

The voltage value of an electron acceleration structure 2 is −2 kV. After the electron beam generated by the electron source 1 passes through the electron acceleration structure 2, the movement speed of the electron beam is increased.

The voltage value of the first beam guide 3 is 10 kV. An acceleration electric field is formed between the electron acceleration structure 2 and the first beam guide 3, and the electron beam passing through the acceleration structure enters the first beam guide 3 after being accelerated. The electron beam maintains moving at a high speed in the first beam guide 3, which is configured to reduce the space charge effect in the electron beam. The first lens device 4 is arranged on the outer periphery of the first beam guide 3, and the first lens device 4 may be a magnetic lens configured to converge the electron beam moving at a high speed in the first beam guide 3.

The electron beam passes through the first beam guide 3, successively passes through the central hole of the annular second detector 5 and the central hole of the annular control electrode 6, and enters the second beam guide 8, the voltage value of the second beam guide 8 is 10 kV. The electron beam maintains moving at a high speed in the second beam guide 8, which is configured to reduce the space charge effect in the electron beam.

The second lens device 11 is arranged on the outer periphery of the second beam guide 8. The second lens device 11 has a composite electromagnetic lens structure, and is constituted by the magnetic lens and a decelerating electric lens formed between the lower end of the second beam guide 8 and the specimen stage 13. The voltage value of the specimen stage 13 is 0 kV. The drop point energy of the electron beam incident on the specimen to be tested 12 is 5 keV. A deflection device is arranged between the second beam guide 8 and the second lens device 11. The deflection device is configured to change the movement direction of the electron beam incident on the specimen to be tested 12, so as to generate a scanning field in any deflection direction.

In the above arrangement, the deflection means includes a first deflector 9 and a second deflector 10, and more deflectors may also be involved in the scanning of the electrons. The first deflector 9 may be a magnetic deflector or an electrical deflector, and the second deflector 10 may be a magnetic deflector or an electrical deflector. The first deflector 9 and the second deflector 10 cooperate to change the movement direction of the electron beam before incident on the specimen to be tested 12. The second lens device 11 is arranged on the outer periphery of the second beam guide 8. The electron beam passes through the second beam guide 8, and passes through the upper pole piece and the lower pole piece of the second lens device 11. The second lens device 11 converges the electron beam to act on the specimen to be tested 12.

The converged scanning electron beam acts on the specimen to be tested 12 to generate the backscattered electrons and secondary electrons. The energy of the secondary electron is low, less than 50 eV, and the energy of the backscattered electron is close to 5 keV. The generated backscattered electrons and secondary electrons pass through the second lens device 11 into the second beam guide 8. The trajectories of the backscattered electrons and secondary electrons form intersections. Since the energy of the secondary electron is low, an intersection formed by the trajectories of the secondary electrons is lower than an intersection formed by the trajectories of the backscattered electrons.

The first detector 7 is arranged between the first beam guide 3 and the second beam guide 8, and is configured to receive secondary electrons generated by the electron beam acting on the specimen to be tested 12. The control electrode 6 is arranged between the first detector 7 and the optical axis 17 of the electron beam. The voltage value of the first detector 7 is 10 kV. The voltage value of the control electrode 6 is 1 kV. The backscattered electrons and secondary electrons pass through the second beam guide 8 and move toward the control electrode 6.

The voltage value of the first beam guide 3 is 10 kV, the voltage value of the second beam guide 8 is 10 kV, the voltage value of the control electrode 6 is 1 kV. A deceleration electric field is formed between the second beam guide 8 and the control electrode 6. An acceleration electric field is formed between the control electrode 6 and the first beam guide 3.

Since the energy of the secondary electron is low, when it moves to the deceleration electric field formed between the second beam guide 8 and the control electrode 6, it is greatly influenced by the deceleration electric field. The movement direction of the secondary electrons is changed. Since the diameter of the central hole of the annular control electrode 6 is smaller than that of the second beam guide 8, and the control electrode 6 has a porous structure, part of the secondary electrons would directly pass through the control electrode 6 and be received by the first detector 7.

The secondary electrons passing through the central hole of the control electrode 6 are influenced by the deceleration electric field formed between the second beam guide 8 and the control electrode 6, and the movement speed of the secondary electrons is decreased. Since the voltage value of the first detector 7 is 10 kV and the voltage value of the control electrode 6 is 1 kV, the decelerated secondary electrons are attracted by the first detector 7, so that the decelerated secondary electrons pass through the holes of the control electrode 6 and are received by the first detector 7.

Since the energy of the backscattered electron is high, the backscattered electrons would pass through the central hole of the control electrode 6 and be received by the second detector 5 arranged at the lower end of the first beam guide 3. The second detector 5 is at the same voltage value as the first beam guide 3, and the voltage value is 10 kV.

In an electron microscope according to an embodiment of the present disclosure, a control electrode 6 is arranged between a first beam guide 3 and a second beam guide 8, the control electrode 6 changes the movement directions of backscattered electrons and secondary electrons generated by an electron beam generated by an electron source 1 acting on a specimen to be tested 12. The control electrode 6 cooperates with the electric field between the first beam guide 3 and the second beam guide 8 to separate the secondary electrons and the backscattered electrons, so that the second detector 5 can receive pure backscattered electrons generated by the electron beam acting on the specimen to be tested 12. The first detector 7 can receive pure secondary electrons generated by the electron beam acting on the specimen to be tested 12.

As shown in FIGS. 1 to 4, in some alternative embodiments, the electron source 1 is configured to generate an electron beam. Electron sources 1 may be classified as field emission sources and thermal emission sources. A field emission source includes a thermal field and a cold field. A thermal emission source includes a tungsten wire, lanthanum hexaboride, and the like. In the present disclosure, the electron source 1 may be any electron source 1 configured to generate an electron beam. The voltage value $V1$ of the electron source 1 according to the embodiment can optionally be any value between 0 kV and −15 kV.

The voltage value $V2$ of the electron acceleration structure 2 can optionally be any value between 3 kV and −12 kV. After the electron beam generated by the electron source 1 passes through the electron acceleration structure 2, the movement speed of the electron beam is increased.

The voltage value $V3$ of the first beam guide 3 is 10 kV. An acceleration electric field is formed between the electron acceleration structure 2 and the first beam guide 3, and the electron beam passing through the acceleration structure enters the first beam guide 3 after being accelerated. The electron beam maintains moving at a high speed in the first beam guide 3, which is configured to reduce the space charge effect in the electron beam. The first lens device 4 is arranged on the outer periphery of the first beam guide 3, and the first lens device 4 may be a magnetic lens configured to converge the electron beam moving at a high speed in the first beam guide 3.

The electron beam passes through the first beam guide 3, successively passes through the central hole of the annular second detector 5 and the central hole of the annular control electrode 6, and enters the second beam guide 8, the voltage value $V7$ of the second beam guide 8 is 10 kV. The electron beam maintains moving at a high speed in the second beam guide 8, which is configured to reduce the space charge effect in the electron beam.

The second lens device 11 is arranged on the outer periphery of the second beam guide 8. The second lens device 11 has a composite electromagnetic lens structure, and is constituted by the magnetic lens and a decelerating electric lens formed between the lower end of the second beam guide 8 and the specimen stage 13. The voltage value $V8$ of the specimen stage 13 is 0 kV. A deflection device is arranged between the second beam guide 8 and the second lens device 11. The deflection device is configured to change the movement direction of the electron beam incident on the specimen to be tested 12, so as to genereate the scanning field in any deflection direction.

In the above arrangement, the deflection means includes a first deflector 9 and a second deflector 10, and more deflectors may also be involved in the scanning of the electrons. The first deflector 9 may be a magnetic deflector or an electrical deflector, and the second deflector 10 may be a magnetic deflector or an electrical deflector. The first deflector 9 and the second deflector 10 cooperate to change the movement direction of the electron beam before incident on the specimen to be tested 12. The second lens device 11 is arranged on the outer periphery of the second beam guide 8. The electron beam passes through the second beam guide 8, and passes through the upper pole piece and the lower pole piece of the second lens device 11. The second lens device 11 converges the electron beam to act on the specimen to be tested 12.

The converged scanning electron beam acts on the specimen to be tested 12 to generate the backscattered electrons and secondary electrons. The energy of the secondary electron is low, and the energy of backscattered electron is high. The generated backscattered electrons and secondary electrons pass through the second lens device 11 into the second beam guide 8. The trajectories of the backscattered electrons and secondary electrons form intersections. Since the energy of the secondary electron is low, an intersection formed by the trajectories of the secondary electrons is lower than an intersection formed by the trajectories of the backscattered electrons.

The first detector 7 is arranged between the first beam guide 3 and the second beam guide 8, and is configured to receive secondary electrons generated by the electron beam acting on the specimen to be tested 12. The control electrode 6 is arranged between the first detector 7 and the optical axis 17 of the electron beam. The voltage value $V6$ of the first detector 7 is 10 kV. The voltage value $V5$ of the control electrode 6 is optionally any value between 0 kV and 10 kV. The backscattered electrons and secondary electrons pass through the second beam guide 8 and move toward the control electrode 6.

The voltage value $V3$ of the first beam guide 3 is 10 kV, the voltage value $V7$ of the second beam guide 8 is 10 kV, the voltage value $V5$ of the control electrode 6 is optionally any value between 0 kV and 10 kV. A deceleration electric field is formed between the second beam guide 8 and the control electrode 6. An acceleration electric field is formed between the control electrode 6 and the first beam guide 3.

Since the energy of the secondary electron is low, when it moves to the deceleration electric field formed between the second beam guide 8 and the control electrode 6, it is greatly influenced by the deceleration electric field. The movement direction of the secondary electrons is changed. Since the diameter of the central hole of the annular control electrode 6 is smaller than that of the second beam guide 8, and the control electrode 6 has a porous structure, part of the secondary electrons would directly pass through the control electrode 6 and be received by the first detector 7.

The secondary electrons passing through the central hole of the control electrode 6 are influenced by the deceleration electric field formed between the second beam guide 8 and the control electrode 6, and the movement speed of the secondary electrons is decreased. Since the voltage value $V4$ of the first detector 7 is 10 kV, the voltage value $V5$ of the control electrode 6 is optionally any value between 0 kV and 10 kV, the decelerated secondary electrons are attracted by the first detector 7, so that the decelerated secondary electrons pass through the holes of the control electrode 6 and are received by the first detector 7.

Since the energy of the backscattered electron is high, the backscattered electrons would pass through the central hole of the control electrode 6 and be received by the second detector 5 arranged at the lower end of the first beam guide 3. The voltage value V4 of the first detector 5 is the same as the voltage value V3 of the first beam guide 3, the voltage value V4 is 10 kV, and the voltage value V3 is 10 kV.

In an electron microscope according to an embodiment of the present disclosure, a control electrode 6 is arranged between a first beam guide 3 and a second beam guide 8, the control electrode 6 changes the movement directions of backscattered electrons and secondary electrons generated by an electron beam generated by an electron source 1 acting on a specimen to be tested 12. The control electrode 6 cooperates with the electric field between the first beam guide 3 and the second beam guide 8 to separate the secondary electrons and the backscattered electrons, so that the second detector 5 can receive pure backscattered electrons generated by the electron beam acting on the specimen to be tested 12. The first detector 7 can receive pure secondary electrons generated by the electron beam acting on the specimen to be tested 12.

It should be noted that the voltage values of the electron source 1, the electron acceleration structure 2, the first beam guide 3, the control electrode 6, the first detector 7, the second beam guide 8, the second detector 5, the specimen stage 13, and the like are not limited to the preferred values of the above embodiments, and those skilled in the art may set a specific voltage value according to the actual situation.

For example, when the voltages applied to the first beam guide 3, the control electrode 6, and the second beam guide 8 are changed, a deceleration electric field is formed between the second beam guide 8 and the control electrode 6. Since the voltage value applied to the second beam guide 8 and the control electrode 6 is changed, the intensity of the deceleration electric field is also changed. An deceleration electric field is formed between the control electrode 6 and the first beam guide 3. Since the voltage values applied to the control electrode 6 and the first beam guide 3 is changd, the intensity of the acceleration electric field is also changed. The backscattered electrons and secondary electrons generated by the converged scanning electron beam acting on the specimen to be tested 12 are collectively referred to as signal electrons. The signal electrons have different energies, and the signal electrons of different energies reflect different information of the specimen to be tested 12. Since both the intensity of the deceleration electric field and the intensity of the acceleration electric field can be changed as needed, the electric field forces applied to the signal electrons of different energies in the deceleration electric field and the acceleration electric field are different, and therefore the trajectories of the signal electrons of different energies are changed differently. The first detector 7 and the second detector 5 may selectively detect signal electrons of different energies. Those skilled in the art may adjust the voltage values of the electron source 1, the electron acceleration structure 2, the first beam guide 3, the control electrode 6, the first detector 7, the second beam guide 8, the second detector 5, the specimen stage 13, and the like to acquire the required signal electrons of the corresponding energies.

The above description is merely the preferred embodiments of the present disclosure, and is not intended to limit the present disclosure in any form. Although the present disclosure has been disclosed in the preferred embodiments as above, it is not intended to limit the present disclosure. Any person skilled in the art who is familiar with the present disclosure shall, without departing from the technical solution of the present disclosure, make some changes or modifications to the technical content of the present disclosure as equivalent embodiments. However, without departing from the technical solution of the present disclosure, any simple modifications, equivalent changes and modifications made to the above embodiments in accordance with the technical essence of the present disclosure shall still fall within the scope of the present disclosure.

The invention claimed is:

1. An electron microscope, comprising:
   an electron source, configured to generate an electron beam;
   a first beam guide, configured to accelerate the electron beam;
   a second beam guide, configured to accelerate the electron beam;
   a first detector arranged between the first beam guide and the second beam guide, configured to receive secondary electrons generated by the electron beam acting on a specimen to be tested; and
   a control electrode arranged between the first detector and an optical axis of the electron beam, configured to change movement directions of backscattered electrons and the secondary electrons generated by the electron beam acting on the specimen to be tested.

2. The electron microscope of claim 1, wherein the control electrode has a porous structure.

3. The electron microscope of claim 2, wherein the control electrode is of an annular shape, a groove is provided on an outer side wall of the annular shape, and the first detector is arranged in the groove.

4. The electron microscope of claim 3, wherein the groove is an annular groove.

5. The electron microscope of claim 4, wherein the first detector comprises a plurality of first detectors circumferentially spaced in the annular groove.

6. The electron microscope of claim 3, wherein a radial cross-section of the groove comprises a first section, a second section, and a third section connected in sequence in a top-to-bottom direction, and the third section is inclined downwardly at a first angle to a horizontal plane.

7. The electron microscope of claim 6, wherein the first angle is in an angle range of fifteen degrees to seventy-five degrees.

8. The electron microscope of claim 6, wherein the third section is a curve.

9. The electron microscope of claim 6, wherein the first section is inclined upwardly at a second angle to the horizontal plane, the second angle in an angle range of zero degrees to ninety degrees, and the second section is arranged perpendicular to the horizontal plane.

10. The electron microscope of claim 1, further comprising:
    a second detector arranged between the first beam guide and the control electrode, configured to receive backscattered electrons generated by the electron beam acting on the specimen to be tested.

* * * * *